(12) United States Patent
Rand

(10) Patent No.: US 7,872,241 B2
(45) Date of Patent: Jan. 18, 2011

(54) METHOD AND APPARATUS FOR PRODUCTION AND MAINTENANCE OF ELECTRON BEAM SPACE-CHARGE NEUTRALIZATION

(75) Inventor: Roy E. Rand, Palo Alto, CA (US)

(73) Assignee: Telesecurity Sciences, Inc., Las Vegas, NV (US)

( * ) Notice: Subject to any disclaimer, the term of this patent is extended or adjusted under 35 U.S.C. 154(b) by 258 days.

(21) Appl. No.: 12/274,067

(22) Filed: Nov. 19, 2008

(65) Prior Publication Data

US 2010/0123087 A1 May 20, 2010

(51) Int. Cl.
*G21K 1/08* (2006.01)
*H01J 3/14* (2006.01)
*H01J 3/26* (2006.01)
*H01J 49/42* (2006.01)

(52) U.S. Cl. .................. 250/396 R; 250/492.3; 250/396 ML; 250/398; 378/138; 378/12; 378/123; 378/137; 378/10; 378/121; 378/4; 378/149; 378/147; 378/15

(58) Field of Classification Search .......... 250/396 R, 250/492.3, 396 ML, 398; 378/138, 12, 123, 378/137, 10, 121, 4, 149, 147, 15
See application file for complete search history.

(56) References Cited

U.S. PATENT DOCUMENTS 6,735,271 B1 * 5/2004 Rand et al. ............ 378/4

7,020,232 B2 * 3/2006 Rand et al. ............ 378/4

OTHER PUBLICATIONS

R.E.Rand; "Transport of Self-Field Dominated DC low-Energy Electron Beams through Low-Pressure Gases"; J. Appl. Phys. 62 (5), Sep. 1, 1987, pp. 1639-1654.

* cited by examiner

*Primary Examiner*—Jack I Berman
*Assistant Examiner*—Meenakshi S Sahu
(74) *Attorney, Agent, or Firm*—Small Patent Law Group LLP; Dean D. Small; Phillip A. Shipley

(57) ABSTRACT

An electron beam production and control assembly includes a vacuum chamber, a beam source, and a target. The target has an active section and an inactive section. The active section is adapted to generate x-rays when the beam impinges on the x-ray producing section. The electron beam production and control assembly also includes a focusing unit positioned along the chamber at a location intermediate the rearward end and the forward end. The focusing unit directs the beam towards the target in a converging manner to impinge on the target. The focusing unit sweeps the beam along a scanning path over the active section of the target. The focusing unit moves the beam to a retrace path on the inactive section of the target between sweeps of the scanning path to maintain ion accumulation in the beam between sweeps over the active section.

26 Claims, 4 Drawing Sheets

METHOD AND APPARATUS FOR PRODUCTION AND MAINTENANCE OF ELECTRON BEAM SPACE-CHARGE NEUTRALIZATION

BACKGROUND OF THE INVENTION

This invention relates generally to scanning electron beam scanners and more particularly to a method and apparatus to produce and maintain electron beam space-charge neutralization.

Scanning electron beam scanners, such as those used in computed tomography (CT) imaging systems, produce cross-sectional and three-dimensional (3D) images of the human body and objects such as baggage and cargo. The scanning electron beam permits fast scan speeds, e.g. 50 msec/scan, so that rapidly moving objects such as the human heart can be imaged.

Conventional scanning electron beam scanners include an electron gun that produces an electron beam inside a highly evacuated chamber. The electron beam expands from its point of origin, e.g. the electron gun, because of the mutual electrostatic repulsion of the electrons in the beam. Where the beam is sufficiently large, it passes through a magnetic lens and a dipole deflecting magnet which scans the electron beam along a target located at the far end of the vacuum chamber to produce x-rays. These x-rays pass through the object being imaged and their intensity is measured by an array of x-ray detectors. X-ray absorption along lines through the object can be calculated and a cross-sectional image of the object can be digitally reconstructed.

For medical applications in particular, the electron beam is required to have an energy of up to approximately 140 keV, a current of up to approximately 1 Amp, and a beam spot width of less than 1 mm. Such parameters are mutually incompatible for an electron beam in pure vacuum where the space-charge repulsion of the beam produces much larger beam spots. More specifically, when the electron gun is activated the electron beam is produced. Initially, the electrons located near a center of the electron beam repel the electrons located at a radially outer edge of the electron beam causing the diameter of the electron beam to expand making focusing the beam more difficult. To overcome this problem, one conventional scanning electron beam scanner neutralizes the space charge of the electron beam by introducing nitrogen into the beam tube and maintaining the pressure within the beam tube at approximately $10^{-6}$ Torr. This pressure, which is much higher than a normal good vacuum pressure, ensures that the electron beam will neutralize itself rapidly by means of its own beam-generated plasma. More specifically, the negatively charged electrons in the beam interact with the gas creating positive ions. As the ions buildup in the beam, the width of the focal spot of the beam decreases to a small value limited only by the emittance of the beam.

To maintain approximately $10^{-6}$ Torr vacuum pressure within the beam tube, the conventional scanning electron beam scanner includes a combination of cryopumps and pressure control servo-valves. However, the cryopumps and servo-valves are relatively expensive and require a sophisticated mechanical vacuum system, thus increasing the overall cost and complexity of the conventional scanning electron beam scanner.

Moreover, during a conventional scanning procedure, the electron beam is incident on a conventional target where it produces x-rays. After the scanning procedure is completed, the electron gun that produces the electron beam is deactivated. However, when the conventional electron gun is deactivated all the positive ions accumulated in the electron beam are lost. The ions must then be regenerated each time the electron gun is reactivated and the electron beam enters the scan chamber to again neutralize the space charge of the electron beam. The time required to regenerate the quantity of ions necessary to neutralize the space charge of the electron beam each time the electron gun is activated may not be a significant issue in some applications. However, in other applications such as a cardiac scanner or a baggage handling system, the time required to re-neutralize the space charge of the electron beam may cause significant time delays that affect the overall performance of the system unless the vacuum system is operated at as high a pressure as possible.

BRIEF DESCRIPTION OF THE INVENTION

In one embodiment, an electron beam production and control assembly is provided. The electron beam production and control assembly includes a vacuum chamber having opposite rearward and forward ends, and a beam source located at the rearward end of the vacuum chamber. The beam source produces an electron beam that accumulates ions while the beam is produced. The beam source directs the beam along a path towards the forward end of the chamber. The electron beam production and control assembly also includes a target located at the forward end of the chamber. The target has an active section and an inactive section. The active section is adapted to generate x-rays that are directed through a scanner field when the beam impinges on the x-ray producing section. The electron beam production and control assembly also includes a focusing unit positioned along the chamber at a location intermediate the rearward end and the forward end. The focusing unit directs the beam towards the target in a converging manner to impinge on the target. The focusing unit sweeps the beam along a scanning path over the active section of the target. The focusing unit moves the beam to a retrace path on the inactive section of the target between sweeps of the scanning path to maintain ion accumulation in the beam between sweeps over the active section and to avoid the delay due to regeneration of the ions.

In another embodiment, a target for an electron beam production and control assembly is provided. The electron beam production and control assembly includes an electron source and a focusing unit. The target includes a base, an active section coupled to the base, and an inactive section coupled to the base. The focusing unit directs an electron beam towards the target in a converging manner to impinge on the target. The focusing unit sweeps the beam along a scanning path over the active section of the target. The focusing unit moves the beam to a retrace path on the inactive section of the target to maintain ion accumulation in the beam between sweeps over the active section.

In another embodiment, another electron beam production and control assembly is provided. The electron beam production and control assemblies include a vacuum chamber having opposite rearward and forward ends and beam sources located at the rearward end of the vacuum chamber. Each beam source produces an electron beam that accumulates ions while the beam is produced and directs the beam along a path towards the forward end of the chamber. The electron beam production and control assemblies also include a common target located at the forward end of the chamber. The target has a first active section and a second active section and a first inactive section and a second inactive section. The first and second active sections generate x-rays that are directed through a scanner field when the beams impinge on the x-ray producing sections. Each electron beam production and control assembly also includes a focusing unit positioned along the chamber at a location intermediate the rearward end and the forward end. Each focusing unit directs a beam towards the target in a converging manner to impinge on the target. The first focusing unit sweeps a beam along a first scanning path on the first active section of the target. The second focusing unit sweeps a beam along a second scanning path on the second active section of the target. While each focusing unit is sweeping its beam over its active section of the target, the other focusing unit is sweeping its beam over its inactive section of the target to maintain ion accumulation in the beams between sweeps over the active sections.

In another embodiment, another electron beam production and control assembly is provided. The electron beam production and control assemblies include a vacuum chamber having opposite rearward and forward ends and beam sources located at the rearward end of the vacuum chamber. Each beam source produces an electron beam that accumulates ions while the beam is produced. Each beam source directs the beam along a path towards the forward end of the chamber. The electron beam production and control assemblies also include a scanning target located at the forward end of the chamber. The scanning target generates x-rays that are directed through a scanner field when the beams impinge on the scanning target. The electron beam production and control assemblies also include a parking target located at the forward end of the chamber, the parking target substantially inhibiting the generation of x-rays, and focusing units. Each focusing unit is positioned along the chamber at a location intermediate the rearward end and the forward end. Each focusing unit directs a beam towards the scanning target in a converging manner to impinge on the scanning target. Each focusing unit sweeps the beam along a scanning path over the scanning target. Each focusing unit moves the beam to a retrace path on the parking target to maintain ion accumulation in the beams between scans of the scanning target.

In another embodiment, a beam source for an electron beam production and control assembly is provided. The beam source includes a cathode and a modulating anode disposed downstream from the cathode. The modulating anode is adapted to vary and maintain a current of the electron beam received from the cathode at a fixed value. The beam source also includes an anode disposed downstream from the modulating anode.

DETAILED DESCRIPTION OF THE INVENTION

Figure 1:
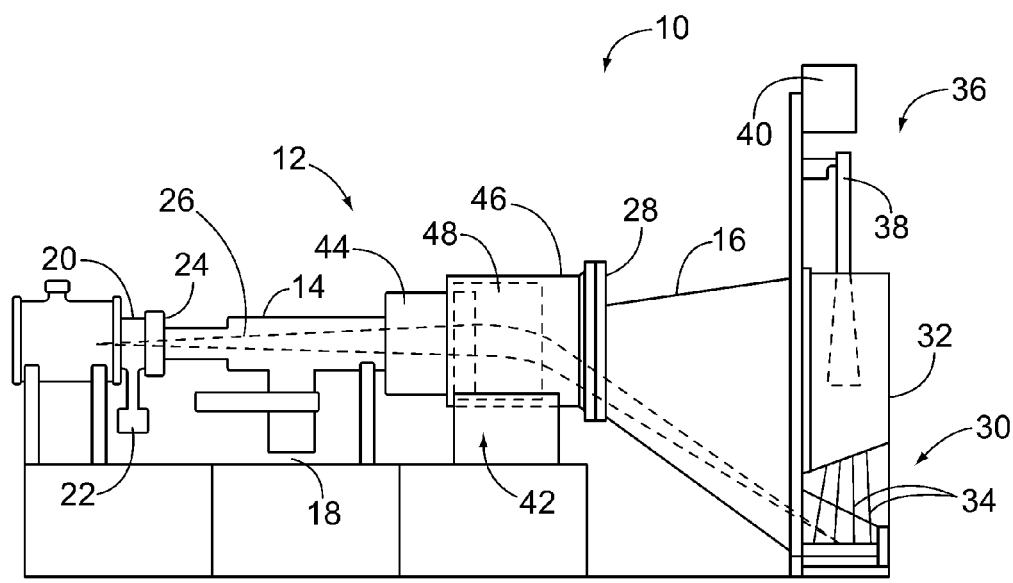
FIG. 1 is an elevation view of an exemplary electron beam production and control assembly in accordance with an embodiment of the present invention.

FIG. 1 is an elevation of an exemplary electron beam production and control assembly 10 in accordance with an embodiment of the present invention. The assembly 10 may be embodied as a scanning electron beam computed tomography (CT) scanner. Optionally, the assembly 10 may be embodied as a medical scanner, a baggage scanner or any other imaging device in accordance with an embodiment of the present invention. In the exemplary embodiment, the assembly 10 includes a vacuum chamber 12 that includes a first chamber section 14 and a second chamber section 16 that is disposed downstream from the first chamber section 14. As shown in FIG. 1, the assembly 10 may include a vacuum pump 18 acting on the vacuum chamber 12. In the exemplary embodiment, a beam source 20, e.g. an electron gun, which may include its own vacuum pump 22, is located at the rearwardmost end 24 of the vacuum chamber 12. In operation, the beam source 20 produces an electron beam 26 that is directed horizontally in a continuously expanding fashion through the first chamber section 14 to the forward most end 28 of the first chamber section 14 where it is acted upon in the manner to be discussed hereinafter. The cross section of electron beam 26 between beam source 20 and the forward most end 28 of the first chamber section 14 is substantially circular in configuration.

As illustrated in FIG. 1, the second chamber section 16 is configured to define a somewhat cone shaped chamber section, at least to the extent that it tapers downward and outward from the first chamber section 14. The assembly 10 also includes an exemplary target assembly 30 that is disposed proximate to a forward most end 32 of the second chamber section 16. In the exemplary embodiment, the target assembly 30 includes a plurality of targets 34. At least some of the targets 34 are adapted to produce x-rays as a result of the impingement thereon by the electron beam 26. The x-rays are directed upward through an object or patient (not shown) to a scanner field 36. In the exemplary embodiment, the scanner field 36 is embodied as a number of detectors 38. Overall operation of the scanner is controlled by a computer processing apparatus 40.

In addition to the components thus far described, assembly 10 also includes a focusing unit 42. The focusing unit 42 is positioned along the vacuum chamber 12 at a location that is intermediate between the vacuum chamber rearward and forward ends, 24 and 28, respectively. In the exemplary embodiment, the focusing unit 42 includes a solenoid coil 44 and an assembly of dipole coils 46 that include a set of magnetic quadrupole coils 48. During operation, the focusing unit 42 directs the electron beam 26 towards the target assembly 30 in a converging manner to impinge on at least one of the targets 34 thus focusing the electron beam 26 onto and causing it to scan along the length of any given one of the targets 34. Scanning the electron beam 26 along the length of at least one target 34 causes x-rays to be produced by and emanated from the target 34. In operation, the cross-section of the electron beam 26 at its point of impingement with the target assembly 30 (e.g., the beam spot) is generally elliptical in configuration and is intended to be fixed in size and in radial position (laterally) at all points along the length of the target 34.

Moreover, the orientation of the beam spot at any given point on the target 34 is intended to be fixed relative to the scan path.

Figure 2:
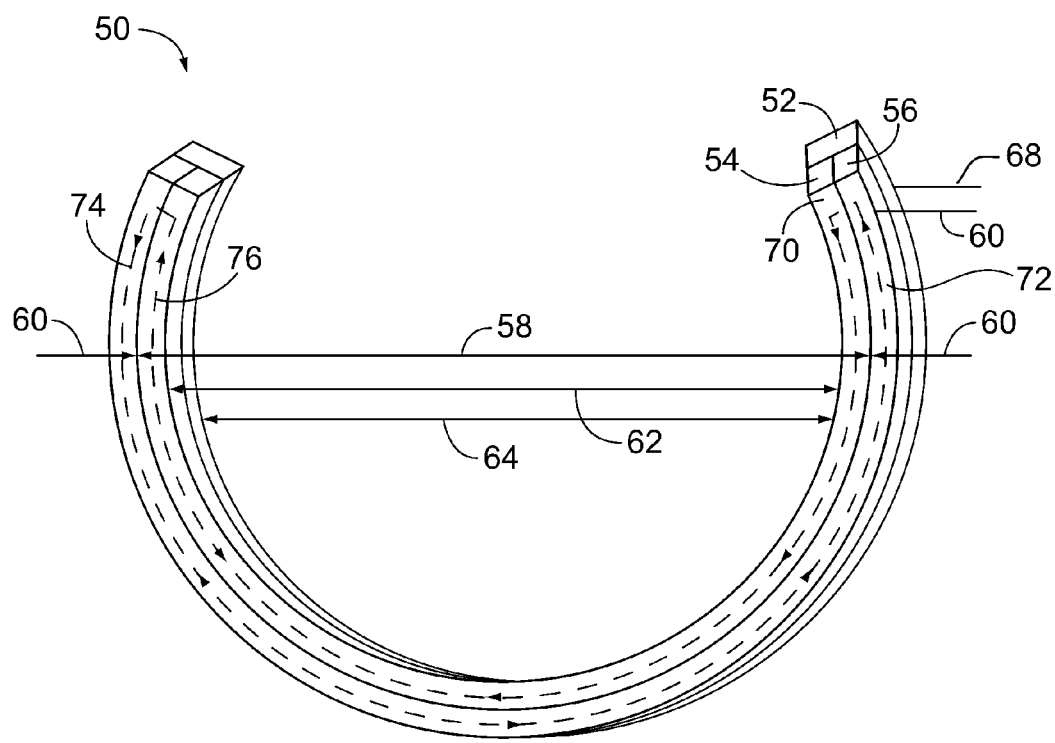
FIG. 2 is a front view of an exemplary target that may be used with the assembly shown in FIG. 1 in accordance with an embodiment of the present invention.

As discussed above, the time required to neutralize the space charge of the electron beam 26 may cause significant time delays that affect the overall performance of the system. Accordingly, FIG. 2 is front view of an exemplary target 50 that may be installed in the target assembly 30 shown in FIG. 1 in accordance with an embodiment of the present invention. In the exemplary embodiment, as shown in FIG. 2, the target 50 is generally arcuate in shape and is configured to extend around the inside of the second chamber section 16 proximate to its forward most end 32. Optionally, the target 50 may have straight sections forming a polygon shape. The target 50 may be formed unitarily or the straight sections may be coupled together to form the polygon shape. The target 50 includes a metallic back 52, an active section 54, and an inactive section 56. The active section 54 is adapted to generate x-rays that are directed through the scanner field 36 when the electron beam 26 impinges on the x-ray producing section, e.g. the active section 54. The inactive section 56 is adapted to substantially inhibit the generation of x-rays when the electron beam 26 impinges on the inactive section 56. The active and inactive sections 54 and 56 are coupled to the metallic back 52 using a brazing procedure, for example. As shown in FIG. 2, the active section 54 is disposed radially inward from the inactive section 56. Optionally, the active section 54 may disposed radially outward from the inactive section 56. The active and inactive sections 54 and 56 are generally complementary in shape to enable the active section 54 to be close fit with the inactive section 56. More specifically, each of the active and inactive sections 54 and 56 has a generally arcuate or polygon shape such that an outer diameter 58 of the active section 54 is approximately equal to an inner diameter 60 of the inactive section 56. Moreover, an inner diameter 62 of the active section 54 is approximately equal an inner diameter 64 of the back 52 and an outer diameter 66 of the inactive section 56 is approximately equal an outer diameter 68 of the back 52.

In the exemplary embodiment, the active section 54 is fabricated from a refractory metal such as tungsten, molybdenum, and/or one of their many alloys. The inactive section 56 is fabricated from a metal that substantially inhibits the production of x-rays when impinged upon by an electron beam. In the exemplary embodiment, the inactive section 56 may be fabricated from a copper material.

The active section 54 has a substantially flat top surface 70 and the inactive section 56 has a substantially flat top surface 72 that is substantially parallel with the top surface 70. The top surface 70 of the active section 54 has a scanning path 74 and the top surface 72 of the inactive section 56 has a retrace path 76. In the exemplary embodiment, the scanning path 74 and retrace path 76 extend along the length of the target 50. Moreover, the scanning path 74 is positioned radially inward from the retrace path 76 and is also positioned substantially parallel to the retrace path 76.

During operation, the focusing unit 42 directs the electron beam 26 onto the inactive section 56 of the target 50 to enable ions to accumulate and reach a steady state in the electron beam 26, e.g. the space charge of the beam is neutralized. Once the space charge of the electron beam 26 is neutralized, the focusing unit 42 directs the electron beam 26 onto the target 50 such that the beam spot shifts between the scanning path 74 and the retrace path 76. In one exemplary embodiment, the focusing unit 42 sweeps the electron beam 26 along the scanning path 74, located on the active section of the target 50, in a counter-clockwise direction. Between sweeps of the scanning path 74, the focusing unit 42 directs the electron beam 26 along the retrace path 76, located on the inactive section of the target 50, in a clockwise direction. Optionally, the focusing unit 42 directs the electron beam 26 along the scanning path 74 in a clockwise direction and along the retrace path 76 in a counter-clockwise direction.

As discussed above, the inactive section 56 of the target 50 is fabricated from a material that is selected to substantially reduce and or eliminate the production of x-rays when impinged upon by the electron beam 26. To further reduce and/or eliminate the production of x-rays when the inactive section 56 is swept by the electron beam 26, a power level of the beam source 20 may be adjusted. In one embodiment, the beam source 20 maintains a power level of the electron beam 26 at a first power level when sweeping the active section 54 of the target 50 and maintains the power level of the electron beam 26 at a second lower power level when sweeping the inactive section 56. Reducing the power level of the electron beam 26, while sweeping the inactive section 56 of the target 50, facilitates further reducing and/or eliminating any radiation that may be emitted from the inactive section 56 of the target 50 during operation. It should be realized that the time to transition between the full power level and the second reduced power level and vice versa is not significant compared to the beam sweep time, e.g. approximately 5 μsecs.

In one exemplary embodiment, before the first scan and during the beam retrace, the electron beam 26 is maintained at a lower energy and a current is selected to maintain the same approximate number of ions as contained in the full power beam. For example, assuming that the full power level of the neutralized electron beam 26 has current I=1000 mA at V=140 kV (beam power 140 kW), the speed of the electrons divided by the speed of light, c, would be $\beta$=0.62. The number of electrons and therefore ions per unit length is equal to I/e$\beta$c. So, as long as this number stays constant, the beam current may be reduced and the ions will remain in the beam. Specifically, if the current (I) is reduced to 500 mA, $\beta$ must be reduced to 0.31, corresponding to V=26.5 kV, resulting in a beam power level of only 13.2 kW. If the original neutralized beam is reduced to this power level without changing the beam geometry, the ions are thus retained in this "parked" beam. In this embodiment, the power level of the electron beam 26 may be weak enough that it need not even be scanned since this power level does not heat the target significantly nor produce a significant level of x-rays when the electron beam 26 impinges on the target 50. In another exemplary embodiment, the beam source 20 is operated at the second or reduced power level only while sweeping the inactive section 56 of the target 50. In this embodiment, the reduced power level is used only to accumulate ions in the electron beam 26. For example, assuming that neutralization time, $t_n$ is proportional to $\beta$, then if $t_n$ for the 140 kV beam is 40 msec (with residual gas pressure at $10^{-8}$ Torr), then for the 26.5 kV beam, $t_n$=20 msec. A single scan would then be delayed by only 20 msec. In the exemplary embodiment, the transition in beam energy is tracked using the beam optics deflection and focusing unit 42.

Accordingly, the time required to sweep the retrace path 76 is less than a time required to sweep the scanning path 74. For example, if the time required to sweep the scanning path 74 is approximately 50 msec, the time required to sweep the retrace path 76 is less than 50 msecs and generally may be any time greater than the lower limit set by the time constants of the deflection system such as 5 msecs for example. If a shorter retrace time is chosen, the assembly 10 may be operated in a multi-scan mode. Optionally, the time required to sweep the retrace path 76 may be set to be equal to the time required to sweep the scanning path 74. The electron beam 26 starts at the beginning of a full retrace path 76 to achieve full neutralization on the first scan. Then the first and every subsequent sweep of the scanning path 74 produces useful images.

In each case described above, the beam source 20 maintains the electron beam 26 continuously active, and without interruption, throughout a scanning cycle over multiple sweeps along the scanning path 74. Moreover, sweeping the retrace path 76, between sweeps of the scanning path 74, enables the beam source 20 to operate continuously and thus maintain ion accumulation in the electron beam 26 between sweeps of the scanning path 74 producing images during each pass or sweep along the target 50.

Figure 3:
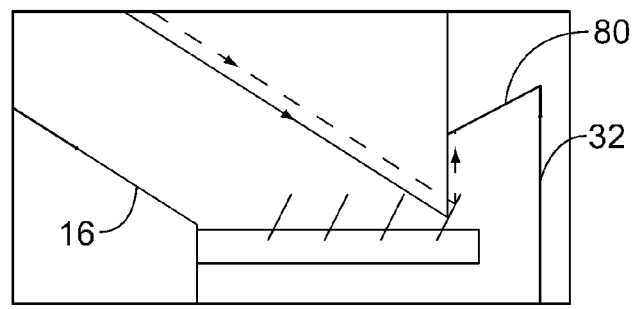
FIG. 3 is a side view of an exemplary shield that may be used with the assembly shown in FIG. 1 in accordance with an embodiment of the present invention.

FIG. 3 is a side view of the target assembly 30 shown in FIG. 1 including the target 50 and an exemplary shield 80. As discussed above, the inactive section 56 of the target 50 is fabricated from a material that is selected to substantially reduce and or eliminate the production of x-rays when impinged upon by the electron beam 26, e.g. copper. In the exemplary embodiment, shown in FIG. 3, the assembly 10 includes a shield 80 to substantially eliminate any resultant x-rays produced by the inactive section 56 from passing through the scanner field 36. In the exemplary embodiment, the shield 80 is coupled to the forward most end 32 of the assembly 10 and is disposed between the inactive section 56 and the scanner field 36. As shown in FIG. 3, the shield 80 has a length that is sufficient to substantially restrict x-rays emitted from the inactive section 56 from entering or passing through the scanner field 36 while still enabling the x-rays produced by the active section 54 to pass by the shield 80 and into the scanner field 36.

Figure 4:
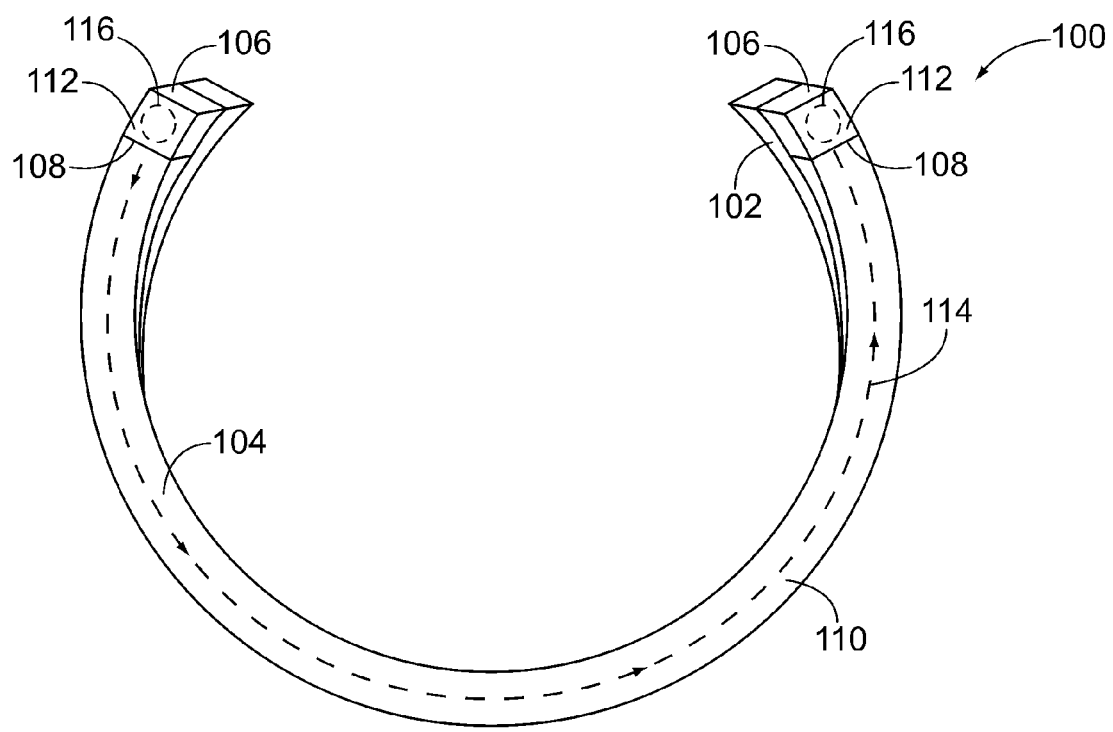
FIG. 4 is a front view of another exemplary target that may be used with the assembly shown in FIG. 1 in accordance with an embodiment of the present invention.

FIG. 4 is a front view of another exemplary target 100 that may installed in the target assembly 30 shown in FIG. 1 in accordance with an embodiment of the present invention. In the exemplary embodiment, the target 50 and the target 100 may each be installed in the target assembly 30. Optionally, either target 50 or target 100 may be separately or in combination be installed in the target assembly 30. In the exemplary embodiment, as shown in FIG. 4, the target 100 is generally arcuate or polygon in shape and is configured to extend around the inside of the second chamber section 16 proximate to its forward most end 32. The target 100 includes a metallic back 102, an active section 104, and a pair of inactive sections 106. In the exemplary embodiment, the pair of inactive sections 106 are coupled to a respective end 108 of the active section 104. The active section 104 is adapted to generate x-rays that are directed through the scanner field 36 when the electron beam 26 impinges on the x-ray producing section, e.g. the active section 104. The inactive sections 106 are adapted to substantially inhibit the generation of x-rays when the electron beam 26 impinges on the inactive sections 106. The active and inactive sections 104 and 106 are coupled to the metallic back 102 using a brazing procedure, for example. In the exemplary embodiment, the active section 104 is fabricated from a refractory metal such as tungsten, molybdenum, and/or one of their many alloys. The inactive sections 106 are fabricated from a metal that substantially inhibits the production of x-rays when impinged upon by an electron beam. In the exemplary embodiment, the inactive sections 106 are each fabricated from a copper material.

The active section 104 has a substantially flat top surface 110 and the inactive sections 106 each have a substantially flat top surface 112 that is substantially parallel with the top surface 110. The top surface 110 of the active section 104 has a scanning path 114 and the top surfaces 112 of the inactive sections 106 each have a retrace path 116. In the exemplary embodiment, the scanning path 114 extends between the ends 108 of the active section 104 and the retrace paths 116 each extend from a respective end of the scanning path 114. Moreover, the each retrace path 116 constitutes a ring shaped closed loop path.

During operation, the focusing unit 42 directs the electron beam 26 onto the inactive sections 106 of the target 100 to enable ions to accumulate and reach a steady state in the electron beam 26, e.g. the space charge of the beam is neutralized. Once the space charge of the electron beam 26 is neutralized, the focusing unit 42 directs the electron beam 26 onto the target 100 such that the beam spot shifts between the scanning path 114 and the retrace paths 116. In one exemplary embodiment, the focusing unit 42 sweeps the electron beam 26 along the scanning path 114, located on the active section of the target 100, in a counter-clockwise direction to a first of the inactive sections 106. The focusing unit 42 then sweeps the ring shaped retrace path 116 on the first of the inactive sections 106 in a closed loop manner and then again sweeps along the scanning path 114 in a clockwise direction to the second of the inactive sections 106. The focusing unit 42 then sweeps the retrace path 116 on the second of the inactive sections 106 in a closed loop manner and then again sweeps along the scanning path 114 in a counter-clockwise direction.

In an exemplary embodiment, the beam source 20 maintains a power level of the electron beam 26 at a first power level when sweeping the active section 104 of the target 100 and maintains the power level of the electron beam 26 at a second lower power level when sweeping the inactive sections 106. Reducing the power level of the electron beam 26, while sweeping the inactive sections 106 of the target 100, facilitates further reducing and/or eliminating any radiation that may be emitted from the inactive sections 106 of the target 100 during operation.

In each case described above, the beam source 20 maintains the electron beam 26 continuously active, and without interruption, throughout a scanning cycle over multiple sweeps along the scanning path 114. Moreover, sweeping the retrace paths 116, between sweeps of the scanning path 114, enables the beam source 20 to operate continuously and thus maintain ion accumulation in the electron beam 26 between sweeps of the scanning path 114 producing useful images at each pass.

Figure 5:
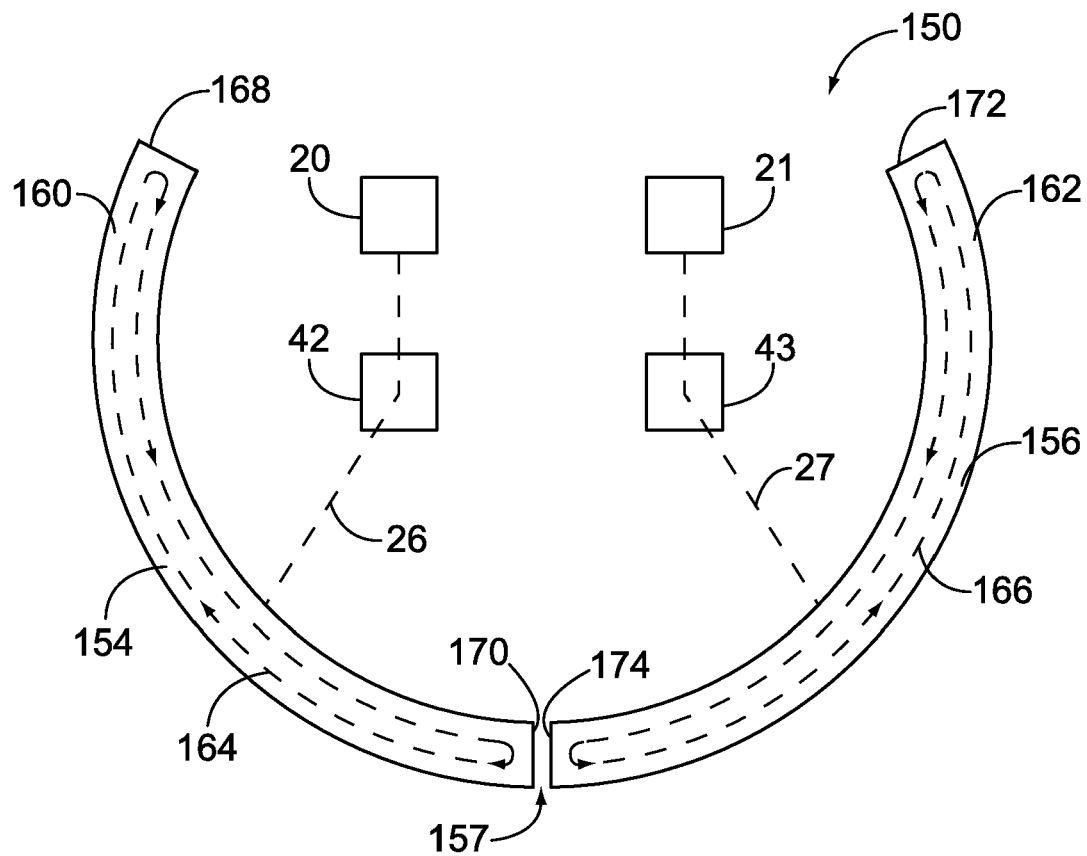
FIG. 5 is a front view of another exemplary target that may be used with two beam sources as shown in FIG. 1 in accordance with an embodiment of the present invention.

FIG. 5 is a front view of another exemplary target 150 that may installed in the target assembly 30 shown in FIG. 1 in accordance with an embodiment of the present invention. In the exemplary embodiment, the target 50, the target 100, and the target 150 may each be installed in the target assembly 30. Optionally, target 50, target 100, or the target 150 may be used separately or in combination in the target assembly 30. In the exemplary embodiment, as shown in FIG. 5, the target 150 is generally arcuate or polygon in shape and is configured to extend around the inside of the second chamber section 16 proximate to its forward most end 32. The target 150 includes a first active section 154 and a second active section 156. In the exemplary embodiment, the pair of active sections 154 and 156 may be separated by a small gap 157 to form the target 150. Optionally, the first active section 154 is close coupled with the second active section 156. The active sections 154 and 156 are each adapted to generate x-rays that are directed through the scanner field 36 when the electron beam 26 impinges on the x-ray producing section, e.g. the active sections 154 and 156. In the exemplary embodiment, the active sections 154 and 156 are each fabricated from a refractory metal such as tungsten, molybdenum, and/or one of their many alloys.

The first active section 154 has a substantially flat top surface 160 and the second active section 156 has a substantially flat top surface 162 that is substantially planar with the top surface 160. The top surface 160 of the first active section 154 has a scanning path 164 and the top surfaces 162 of the second active section 156 has a scanning path 166. In the exemplary embodiment, the scanning path 164 extends between a first end 168 of the first active section 154 to a second end 170 of the first active section 154. The scanning path 166 extends between a first end 172 of the second active section 156 to a second end 174 of the second active section 156.

During operation, the focusing unit 42 directs the electron beam 26 onto the first active section 154 of the target 150 and sweeps the electron beam 26 along the first scanning path 164. The beam source 20 may then be deactivated. In the exemplary embodiment, the assembly 10 includes a second beam source 21 and a second focusing unit 43. During operation, the focusing unit 43 directs an electron beam 27 onto the second active section 156 of the target 150 and sweeps the electron beam 27 along the second scanning path 166. The source 21 may then be deactivated and the source 20 sweeps the beam 26 along the first active section 154. As discussed above, the time required to neutralize the space charge of the electron beam is less than the time required to scan either the first or second scanning paths 164 or 166. Accordingly, when the first beam source 20 is in operation and sweeping the first active section 154, the second beam source 21 may be deactivated. Prior to the first beam source 20 completing the sweep of the first active section 154, the second beam source 21 is activated with sufficient time to neutralize the ions in the second electron beam 27. The first beam source 20 is then deactivated and the second beam source 21, via the second focusing unit 43, sweeps the second active section 156 and vice versa. In one embodiment, each of the focusing units 42 and 43 alternate sweeps of their respective active sections in a circular pattern. Optionally, other sweep patterns may be utilized.

In an exemplary embodiment, the beam source 20 maintains a power level of the electron beam 26 at a first power level when sweeping the active section 154 of the target 150 and maintains the power level of the electron beam 26 at a second lower power level while the second beam source 21 is sweeping the second active section 156. Reducing the power level of the electron beam 26, while the second beam source 21 is sweeping the second active section 156 facilitates further reducing and/or eliminating any radiation that may be emitted from the active sections 156 of the target 100 during operation. The power level of the second beam source 21 may be lowered in a similar fashion during operation. In each case described above, the operation of beam source 20 and the beam source 21 enable the target 150 to be continuously active, and without interruption, throughout a scanning cycle over multiple sweeps along the scanning paths. Reducing the power level of the inactive beam also reduces target heating and reduces the total power required from the high voltage power supply.

Figure 6:
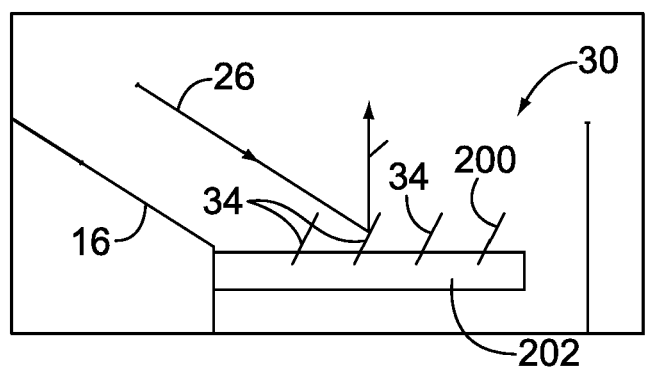
FIG. 6 is an elevation view of an exemplary target assembly that may be used with the electron beam production and control assembly shown in FIG. 1 in accordance with an embodiment of the present invention.
Figure 7:
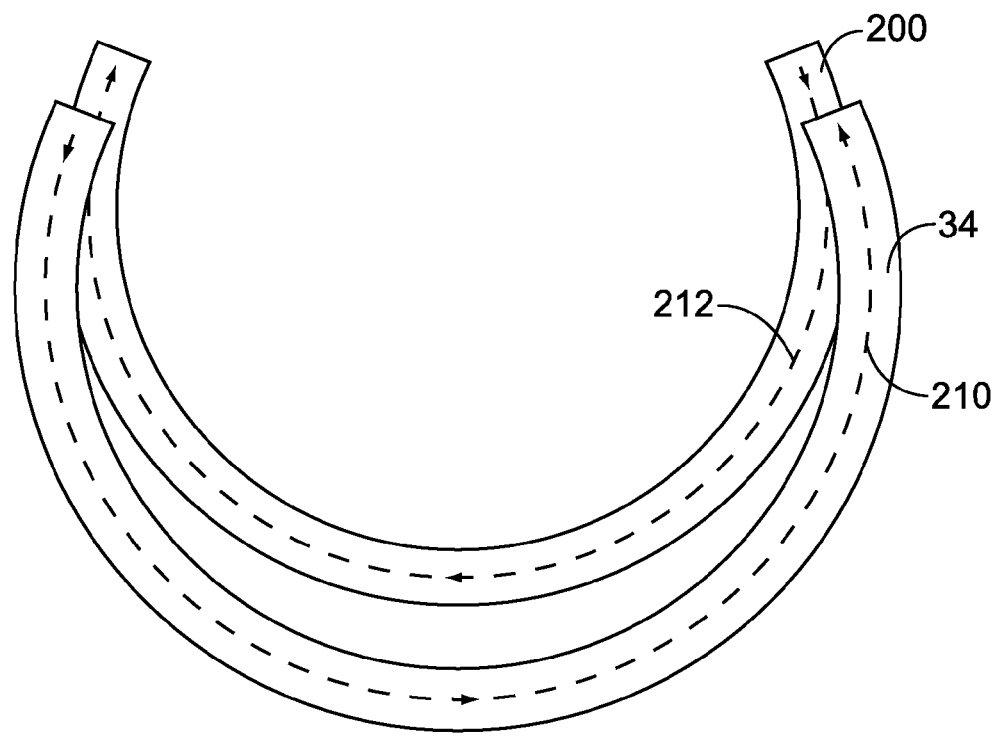
FIG. 7 is a front view of another exemplary target that may be used with the assembly shown in FIG. 1 in accordance with an embodiment of the present invention.

FIG. 6 is an elevation view of the exemplary target assembly 30, shown in FIG. 1. FIG. 7 is a front view of a single scanning target 34 and the exemplary parking target 200 shown in FIG. 6 in accordance with an embodiment of the present invention. As discussed above, the target assembly 30 includes at least one conventional target 34 referred to herein as the scanning target 34. In the exemplary embodiment, the scanning target 34 is fabricated using a tungsten material, is generally arcuate or polygon in shape, and is configured to extend around the inside of the second chamber section 16. In the exemplary embodiment, the target assembly 30 also includes at least one parking target 200 that is utilized to neutralize the space charge or maintain the neutralization of the electron beam 26. The scanning target 34 and the exemplary parking target 200 are each installed on a base 202. It should be realized that although the target assembly 30 is illustrated as having four targets, the target assembly 30 may have at least two, three, or more than four targets and that four targets are illustrated to assist in the description of the invention. Moreover, although the parking target 200 is shown as being installed proximate to the forward most end 32 in the target assembly 30, the exemplary parking target 200 may be installed in any of the slots shown in FIG. 6. The scanning target 34 is adapted to generate x-rays that are directed through the scanner field 36 when the electron beam 26 impinges on the scanning target 34. The parking target 200 is adapted to substantially inhibit the generation of x-rays when the electron beam 26 impinges on the parking target 200. In the exemplary embodiment, the parking target 200 is fabricated from a copper material.

As shown in FIG. 7, the scanning target 34 includes a scanning path 210 and the parking target 200 includes a retrace path 212. In the exemplary embodiment, the scanning path 210 extends along the length of the scanning target 34 and the retrace path 212 extends along the length of the parking target 200.

During operation, the focusing unit 42 initially directs the electron beam 26 onto the parking target 34 to enable ions to accumulate and reach a steady state in the electron beam 26, e.g. the space charge of the beam is neutralized. Once the space charge of the electron beam 26 is neutralized, the focusing unit 42 directs the electron beam 26 onto the scanning target 200. In one exemplary embodiment, the focusing unit 42 sweeps the electron beam 26 along the scanning path 210, located on the scanning target 34 in a counter-clockwise direction. Between sweeps of the scanning path 210, the focusing unit 42 directs the electron beam 26 along the retrace path 212 in a clockwise direction. Optionally, the focusing unit 42 directs the electron beam 26 along the scanning path 210 in a clockwise direction and along the retrace path 212 in a counter-clockwise direction.

As discussed above, the parking target 200 is fabricated from a material that is selected to substantially reduce and or eliminate the production of x-rays when impinged upon by the electron beam 26. To further reduce and/or eliminate the production of x-rays when the parking target 200 is swept by the electron beam 26, a power level of the beam source 20 is adjusted. In one embodiment, the beam source 20 maintains a power level of the electron beam 26 at a first power level when sweeping the scanning target 34 and maintains the power level of the electron beam 26 at a second lower power level when sweeping the parking target 200. Reducing the power level of the electron beam 26, while sweeping the parking target 200 facilitates further reducing and/or eliminating any radiation that may be emitted from the parking target 200 during operation.

In the exemplary embodiment, the time required to sweep the parking target 200 is less than a time required to sweep the scanning target 34. For example, if the time required to sweep the scanning target 34 is approximately 50 msec, the time required to sweep the parking target 200 is less than 50 msecs and generally may be any time greater than the lower limit set by the time constants of the deflection system such as 5 msecs for example. If a shorter retrace time is chosen, the assembly 10 may be operated in a multi-scan mode. Optionally, if the time required to sweep the scanning target 34 is set to be equal to the time required to sweep the parking target 200, the electron beam 26 starts at the beginning of the retrace path 212 to achieve full neutralization on the first scan. Then the first and every subsequent x-ray scan of the scanning target 34 produces useful images.

In each case described above, the beam source 20 maintains the electron beam 26 continuously active, and without interruption, throughout a scanning cycle over multiple sweeps along the scanning path 210. Moreover, alternately sweeping the retrace path 212 between sweeps of the scanning path 210 enables the beam source 20 to operate continuously and thus maintain ion accumulation in the electron beam 26 between sweeps of the scanning path 210 producing images during each pass or sweep along the target 34.

Figure 8:
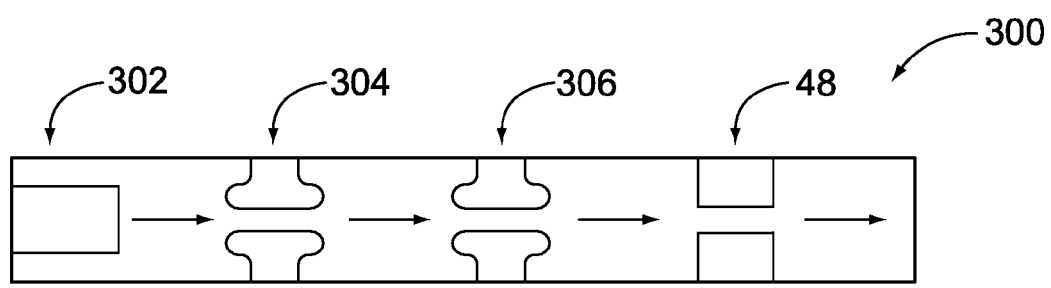
FIG. 8 is a schematic illustration of an exemplary beam source that may be used with the assembly shown in FIG. 1 in accordance with an embodiment of the present invention.

FIG. 8 is a schematic illustration of an exemplary beam source 300 that may be used with the assembly 10 shown in FIG. 1 in accordance with an embodiment of the present invention. The beam source 300 may be in lieu of either beam source 20 or beam source 21 described above. In the exemplary embodiment, the beam source 300 is adapted as a modulated anode electron gun to provide both the required beam conditions and any voltage and current values in between as follows. The beam source 300 includes a cathode 302, a modulating anode 304 disposed downstream from the cathode 302, and a final anode 306 disposed downstream from the modulating anode. In the exemplary embodiment, the final anode 306 is at zero potential, e.g. the final anode 306 is grounded, the potential at the modulating anode 304 is variable, e.g., ~–120 kV, and the potential at the cathode is approximately –140 kV.

During operation, the cathode 302 emits electrons which are accelerated towards the modulating anode 304. Moreover, the current actually being generated, I is proportional to $V^{3/2}$, where V is the difference in potential between the potential seen at the cathode 302 and the potential seen at the modulating anode 304. The modulating anode 304 further accelerates the electrons toward the final anode 306. In the exemplary embodiment, the modulating anode 304 enables the current of the electron beam passing through the modulating anode 304 to be independent of the total voltage of the electron beam. The flow of electrons is then transmitted to a focusing unit, such as focusing unit 42 for example.

During operation, assume that the cathode 302 and the modulating anode 304 are at negative potential with respect to the final anode 306 which is at ground potential. When the beam source 300 is operated at high power, the cathode potential is $V_{CHi}$ (Voltage at Cathode during Hi power)=–140 kV. Moreover, let the modulating anode potential be $V_{MAHi}$ (voltage at modulating anode during Hi power). When the beam source 300 is operated at a lower power, the potential at the cathode in low power $V_{CLo}$=–26.5 kV, the voltage the modulating anode at low power $V_{MALo}$=0, i.e. both anodes are grounded. Then for the high power beam, $(V_{MAHi}-V_{CHi})^{1.5}/26.5^{1.5}=1000/500$. Therefore
$V_{MAHi}$=–97.9 kV.

In another embodiment, the beam source 300 may be operated at the low power setting just to accumulate ions. The beam source 300 may then be operated at the high power setting to scan the active regions of a target. Since the neutralization time, $t_n$ is proportional to β, if $t_n$ for the 140 kV beam is 40 msec (with residual gas pressure at $10^{-8}$ Torr), then for the 26.5 kV beam, $t_n$=20 msec. A single scan would then be delayed by only 20 msec. In the exemplary embodiment, the transition in beam energy is tracked by the beam optics deflection and focusing unit 42.

Described herein is a plurality of targets that may be utilized during a scanning procedure to maintain the space charge neutralization of an electron beam. In one embodiment, the target includes an active region and an inactive region. During operation a beam source alternately scans the active and inactive regions of the target such that the beam source does not need to be deactivated during the scanning process. Thus the exemplary assembly described herein may be operated continuously without damaging the active region of the target. Additionally, described herein is a parking target that may be utilized by the beam source for "parking" the electron beam between scans of an active scanning target. The parking target also enables the exemplary assembly described herein to be operated continuously without damaging the scanning target. Also described herein is a beam source that is adapted as a modulated anode electron gun to provide both required beam conditions and anything in between. The beam source includes a modulating anode that enables the power level of the electron beam to be reduced during operation while maintaining any required current value. During operation, the beam source enables the power level to be decreased while scanning an inactive region of a target and the power level to be increased while scanning an active region of a target. In this case, the modulating anode is adapted to extend the life of the target by reducing the power level seen at the target and thus reducing the heat generated by the target. Each embodiment described herein enables the scanning system to be operated continuously while reducing and or eliminating the heat generated by the target and thus increasing the life of the targets. Reduced power requirements also reduce the size and cost of the high voltage power supplies. Moreover, continuously operating the scanning system reduces and/or eliminates the time required to neutralize the space charge of the electron beam and thus significantly reduces time delays that affect the overall performance of the system.

While the invention has been described in terms of various specific embodiments, those skilled in the art will recognize that the invention can be practiced with modification within the spirit and scope of the claims.

What is claimed is:

1. An electron beam production and control assembly, comprising:
    a vacuum chamber having opposite rearward and forward ends;
    a beam source located at the rearward end of the vacuum chamber, the beam source producing an electron beam that accumulates ions while the beam is produced, the beam source directing the beam along a path towards the forward end of the chamber;
    a target located at the forward end of the chamber, the target having an active section and an inactive section, the active section generating x-rays that are directed through a scanner field when the beam impinges on the x-ray producing section; and
    a focusing unit positioned along the chamber at a location intermediate the rearward end and the forward end, the focusing unit directing the beam towards the target in a converging manner to impinge on the target, the focusing unit sweeping the beam along a scanning path over the active section of the target, the focusing unit moving the beam to a retrace path on the inactive section of the target to maintain ion accumulation in the beam between sweeps over the active section.

2. An electron beam production and control assembly in accordance with claim 1 wherein the beam source maintains the electron beam active continuously, and without interruption, throughout a scanning cycle over multiple sweeps along the scanning path.

3. An electron beam production and control assembly in accordance with claim 1 wherein the focusing unit sweeps the beam along the retrace path between sweeps of the scanning path.

4. An electron beam production and control assembly in accordance with claim 1 wherein the active and inactive sections are arcuately or polygon shaped and arranged adjacent one another such that the scanning path is arc-shaped in a first direction and the retrace path is arc-shaped in an opposite second direction.

5. An electron beam production and control assembly in accordance with claim 1 wherein the inactive section is shielded to prevent x-rays generated by the inactive section from passing through the scanner field.

6. An electron beam production and control assembly in accordance with claim 1 wherein, during an initialization process, the focusing unit directs the beam to the inactive section of the target while the ions accumulate in the beam and achieve a steady state.

7. An electron beam production and control assembly in accordance with claim 1 wherein the beam source maintains a power level of the beam at a first power level when sweeping the active section and maintains the power level of the beam at a second power level when sweeping the inactive section.

8. An electron beam production and control assembly in accordance with claim 1 wherein the inactive section includes a pair of inactive regions located at opposite ends of the active section, the retrace path constitutes ring shaped paths located about the inactive regions at opposite ends of the scanning path.

9. An electron beam production and control assembly in accordance with claim 1 wherein the beam source comprises a modulating anode adapted to vary the current of the beam.

10. An electron beam production and control assembly, comprising:
    a vacuum chamber having opposite rearward and forward ends;
    a beam source located at the rearward end of the vacuum chamber, the beam source producing an electron beam that accumulates ions while the beam is produced, the beam source directing the beam along a path towards the forward end of the chamber;
    a scanning target located at the forward end of the chamber, the scanning target generating x-rays that are directed through a scanner field when the beam impinges on the scanning target;
    a parking target located at the forward end of the chamber, the parking target substantially inhibiting the generation of x-rays; and
    a focusing unit positioned along the chamber at a location intermediate the rearward end and the forward end, the focusing unit directing the beam towards the scanning target in a converging manner to impinge on the scanning target, the focusing unit sweeping the beam along a scanning path over the scanning target, the focusing unit moving the beam to a retrace path on the parking target to maintain ion accumulation in the beam between scans of the scanning target.

11. An electron beam production and control assembly in accordance with claim 10, wherein the scanning target comprises a tungsten target and the parking target comprises a copper target.

12. An electron beam production and control assembly in accordance with claim 10 wherein the focusing unit sweeps the beam along the retrace path between sweeps of the scanning path.

13. An electron beam production and control assembly in accordance with claim 10 further comprising a shield positioned between the parking target and an x-ray detector.

14. An electron beam production and control assembly in accordance with claim 10, wherein the focusing unit sweeping the beam along a scanning path over the scanning target for a first quantity of time, the focusing unit moving the beam along the retrace path on the parking target for a second quantity of time that is less than the first quantity of time.

15. An electron beam production and control assembly in accordance with claim 10 wherein the scanning target and the parking target are each arcuately or polygon shaped and arranged adjacent one another such that the scanning path is arc-shaped in a first direction and the retrace path is arc-shaped in an opposite second direction.

16. A target for an electron beam production and control assembly having an electron source and a focusing unit, the target comprising:
    a base;
    an active section coupled to the base; and
    an inactive section coupled to said base, the focusing unit directing an electron beam towards the target in a converging manner to impinge on the target, the focusing unit sweeping the beam along a scanning path over the active section of the target, the focusing unit moving the beam to a retrace path on the inactive section of the target to maintain ion accumulation in the beam between sweeps over the active section.

17. A target in accordance with claim 16 wherein the inactive section comprises:
    a first inactive section coupled to a first end of the active section; and
    a second inactive section coupled to an opposite end of the active section.

18. A target in accordance with claim 16 wherein the active and inactive sections are arcuately or polygon shaped and arranged adjacent one another such that the scanning path is arc-shaped in a first direction and the retrace path is arc-shaped in an opposite second direction.

19. An electron beam production and control assembly, comprising:
    a vacuum chamber having opposite rearward and forward ends;
    at least one beam source located at the rearward end of the vacuum chamber, the beam source producing an electron beam that accumulates ions while the beam is produced, the beam source being and directing the beam along a path towards the forward end of the chamber;
    a target located at the forward end of the chamber, the target having a first active section and a second active section, the first and second active sections generating x-rays that are directed through a scanner field when the beam impinges on the x-ray producing sections; and
    at least one focusing unit positioned along the chamber at a location intermediate the rearward end and the forward end, the focusing unit directing the beam towards the target in a continuously converging manner to impinge on the target, the focusing unit sweeping the beam along a first scanning path over the first active section of the target, the focusing unit moving the beam to a second scanning path on the second active section of the target to maintain ion accumulation in the beam between sweeps over the active section.

20. An electron beam production and control assembly in accordance with claim 19 further comprising:
    a second beam source located at the rearward end of the vacuum chamber, the second beam source producing a second electron beam that accumulates ions while the beam is produced, the second beam source directing the second electron beam along a path towards the forward end of the chamber; and a second focusing unit positioned along the chamber at a location intermediate the rearward end and the forward end, the second focusing unit directing the second electron beam towards the target in a converging manner to impinge on the second active section, the second focusing unit sweeping the second electron beam along a second scanning path over the second active section of the target to maintain ion accumulation in the second electron beam between sweeps over the second active section.

21. An electron beam production and control assembly in accordance with claim 19 wherein the beam source maintains the electron beam active continuously, and without interruption, throughout a scanning cycle over multiple sweeps along the first and second scanning paths.

22. An electron beam production and control assembly in accordance with claim 19 wherein the focusing unit sweeps the beam along the first scanning path between sweeps of the second scanning path.

23. An electron beam production and control assembly in accordance with claim 19 wherein the focusing unit sweeps the beam along the first scanning path in a first direction and sweeps the beam along the second scanning path in an opposite second direction.

24. A beam source for an electron beam production and control assembly, said beam source comprising a cathode;

a modulating anode disposed downstream from the cathode, the modulating anode adapted to vary a current of an electron beam passing therethrough and maintain a current of the electron beam at a fixed value; and an anode disposed downstream from the modulating anode.

25. A beam source in accordance with claim 24 wherein the anode is at zero potential and a potential of the modulating anode is variable.

26. A beam source in accordance with claim 24 wherein a cathode potential is negative and a potential of the modulating anode is negative.

* * * * *